(12) United States Patent
Greer

(10) Patent No.: US 6,451,681 B1
(45) Date of Patent: Sep. 17, 2002

(54) METHOD OF FORMING COPPER INTERCONNECTION UTILIZING ALUMINUM CAPPING FILM

(75) Inventor: Stuart E. Greer, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/411,266

(22) Filed: Oct. 4, 1999

(51) Int. Cl.[7] ............................................... H01L 21/44
(52) U.S. Cl. ...................... 438/601; 438/132; 438/612; 438/654
(58) Field of Search .................... 438/132, 612, 438/613, 617, 618, 654, 64, 614, 130, 601

(56) References Cited

U.S. PATENT DOCUMENTS

| 5,134,460 A | 7/1992 | Brady et al. ................ 357/71 |
| 5,731,624 A | 3/1998 | Motsiff et al. ............... 257/529 |
| 5,795,819 A | 8/1998 | Motsiff et al. ............... 438/618 |
| 5,864,946 A | * 2/1999 | Eldridge et al. ............... 29/843 |
| 6,133,136 A | * 10/2000 | Edelstein et al. ........... 438/618 |
| 6,187,680 B1 | * 2/2001 | Costrini et al. ............. 438/688 |

* cited by examiner

Primary Examiner—Matthew Smith
Assistant Examiner—Craig P. Lytle
(74) Attorney, Agent, or Firm—Robert A. Rodriguez

(57) ABSTRACT

A mostly copper-containing interconnect (126) overlies a semiconductor device substrate (100), and a transitional metallurgy structure (312, 508, 716, 806) that includes an aluminum-containing film (200, 506, 702, 802) contacts a portion of the mostly copper-containing interconnect. In one embodiment, the transitional metallurgy is formed over a portion of a bond pad (128). In an alternative embodiment, the transitional metallurgy includes an energy alterable fuse portion (710) that electrically contacts two conductive regions (712 and 714), and in yet another embodiment, the transitional metallurgy is formed over a copper-containing edge seal portion (809).

14 Claims, 5 Drawing Sheets

US 6,451,681 B1

METHOD OF FORMING COPPER INTERCONNECTION UTILIZING ALUMINUM CAPPING FILM

RELATED APPLICATIONS

The present Application is related to U.S. patent application Ser. No. 09/285,666 filed Apr. 5, 1999, and entitled "Semiconductor Device and Method of Formation," which is assigned to the assignee hereof and is herein incorporated by reference.

FIELD OF THE INVENTION

This invention relates in general to semiconductor devices and their method of formation, and more particularly to semiconductor devices and methods for forming semiconductor devices having copper-containing interconnects.

BACKGROUND OF THE INVENTION

Copper interconnects are becoming increasingly common as semiconductor dimensions decrease and integrated circuit (IC) performance requirements increase. Copper's advantages over conventional interconnect materials include increased conductivity and improved resistance to electromigration. However, the integration of copper is presenting a variety of challenges for semiconductor manufacturers.

One specific area being challenged includes the use of copper at the uppermost interconnect level to form bond pads. When copper is used to form bond pads, problems can be encountered with chemical or metallurgical attack of the copper. This can occur as a result of the copper bond pad being exposed to an external environment or as a result of materials compatibility issues between the copper bond pad and subsequently formed conductive bumps or wirebonds. All of which can affect the quality and reliability of the integrated circuit. Conventional pad limiting metals (PLMs), which are typically formed over aluminum bond pads to reduce materials interaction problems between bumps and bond pads have largely been ineffective at preventing such problems with copper.

One prior art method attempting to minimize copper's materials interactions with subsequently formed PLMs forms a conductive tantalum nitride film between the PLM and the bond pad. However, this prior art method is typically only used with PLMs that are formed using physical vapor deposition (PVD) methods, such as evaporation or sputtering. Other less costly PLM processes, such as electroplating and electroless plating may be incompatible with the prior art because plating films onto a tantalum nitride surface is not readily accomplished. In addition, wirebonding is not readily adaptable for use with the prior art because the physical properties (i.e. brittleness) of the tantalum nitride film can be problematic. If the stress exerted by the wirebonding operation on the tantalum nitride film is too great, the tantalum nitride film can crack or fracture, thereby exposing portions of the copper bond pad to external environmental conditions. Therefore, the prior art has been limited in its ability to develop a copper bond pad integration scheme that is applicable to a variety of bumping and wirebonding applications.

BRIEF DESCRIPTION OF THE FIGURES

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements and figures may be exaggerated relative to other elements to help improve understanding of embodiments of the present invention.

DETAILED DESCRIPTION

A mostly copper-containing interconnect overlies a semiconductor device substrate, and a transitional metallurgy that includes an aluminum-containing film contacts a portion of the mostly copper-containing interconnect. In one embodiment, the transitional metallurgy is formed over a portion of a bond pad. In an alternative embodiment, the transitional metallurgy includes an energy alterable fuse portion that electrically contacts two conductive regions, and in yet another embodiment, the transitional metallurgy is formed over a copper-containing edge seal portion.

Figure 1:
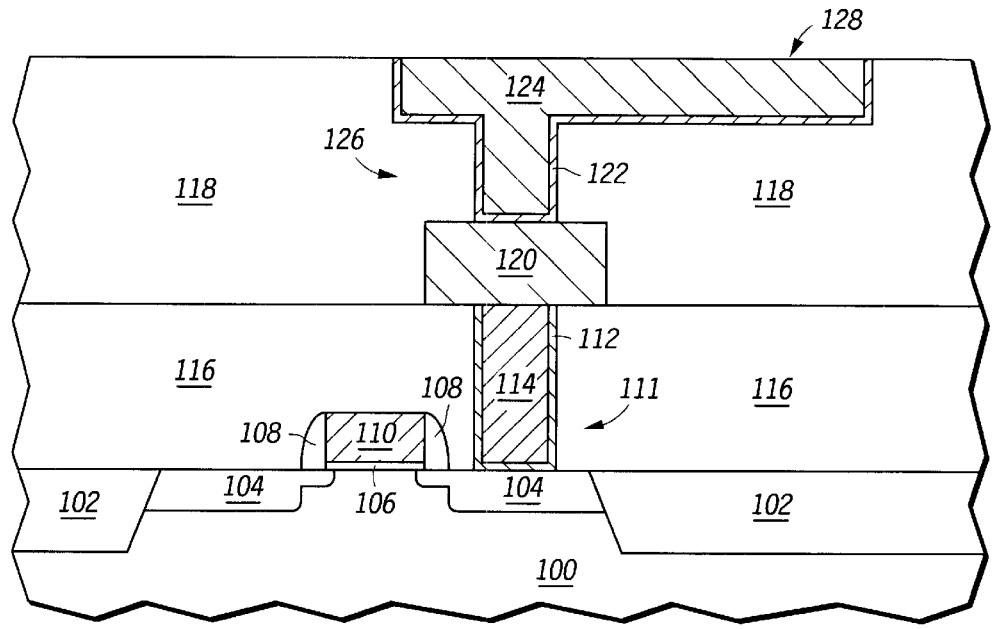
FIG. 1 includes an illustration of a cross-sectional view of a semiconductor device after forming an uppermost interconnect level and bond pad.

An embodiment of the present invention will now be described more fully with references to the accompanying figures. FIG. 1 includes an illustration of a cross-sectional view of a portion of a semiconductor device. The semiconductor device includes a semiconductor device substrate 100, field isolation regions 102, and doped regions 104 formed within the semiconductor device substrate 100. A gate dielectric layer 106 overlies portions of the semiconductor device substrate 100 and a gate electrode 110 overlies the gate dielectric layer 106. Spacers 108 are formed adjacent the sidewalls of the gate electrode 110. A first interlevel dielectric layer 116 is patterned to form a contact opening that is filled with an optional adhesion layer 112 and a contact fill material 114. The adhesion layer 112 is typically a refractory metal, a refractory metal nitride, or combination of refractory metals or their nitrides. The contact fill material 114 typically includes tungsten, polysilicon, or the like. After depositing the adhesion layer 112 and the contact fill material 114, the substrate is polished to remove portions of the adhesion layer 112 and contact fill material 114 not contained within the contact opening to form the conductive plug 111.

A first level interconnect 120 is then formed overlying the ILD layer 116 and the conductive plug 111. Typically, the first level interconnect 120 is formed using a conductive material such as copper or aluminum. The first level interconnect 120 can be formed using a combination of trench and polishing processes or, alternatively, using a combination of patterning and etching processes. If the first level interconnect 120 is formed using copper, a barrier (not shown) may be formed adjacent the first level interconnect 120 to reduce the migration of copper into surrounding materials.

A second ILD 118 is then formed over the first ILD 116 and the first level interconnect 120. An interconnect 126 that can include a conductive adhesion/barrier film 122 and a copper-fill material 124 is then formed within the second ILD 118. The adhesion/barrier film 122 is typically a refractory metal, a refractory metal nitride, or a combination of refractory metals or their nitrides. The copper-fill material 124 is typically copper or a copper-alloy, wherein the copper content is at least 90 atomic percent. The copper can be alloyed with magnesium, sulfur, carbon, or the like to improve adhesion, electromigration, or other properties of the interconnect. Although, the interconnect 126 is illustrated in this embodiment as a dual inlaid interconnect, one of ordinary skill in the art recognizes that the interconnect 126 can alternatively be formed as a conductive plug in combination with a single inlaid interconnect or a lithographically patterned and etched interconnect. After depositing the adhesion/barrier film 122 and the copper fill material 124, the substrate is polished to remove portions of the adhesion/barrier film 122 and copper fill material 124 not contained within the dual inlaid opening to form the dual inlaid interconnect 126 shown in FIG. 1. In accordance with one embodiment of the present invention, the uppermost exposed surface of the dual inlaid interconnect 126 forms a bond pad 128 for the semiconductor device.

Figure 2:
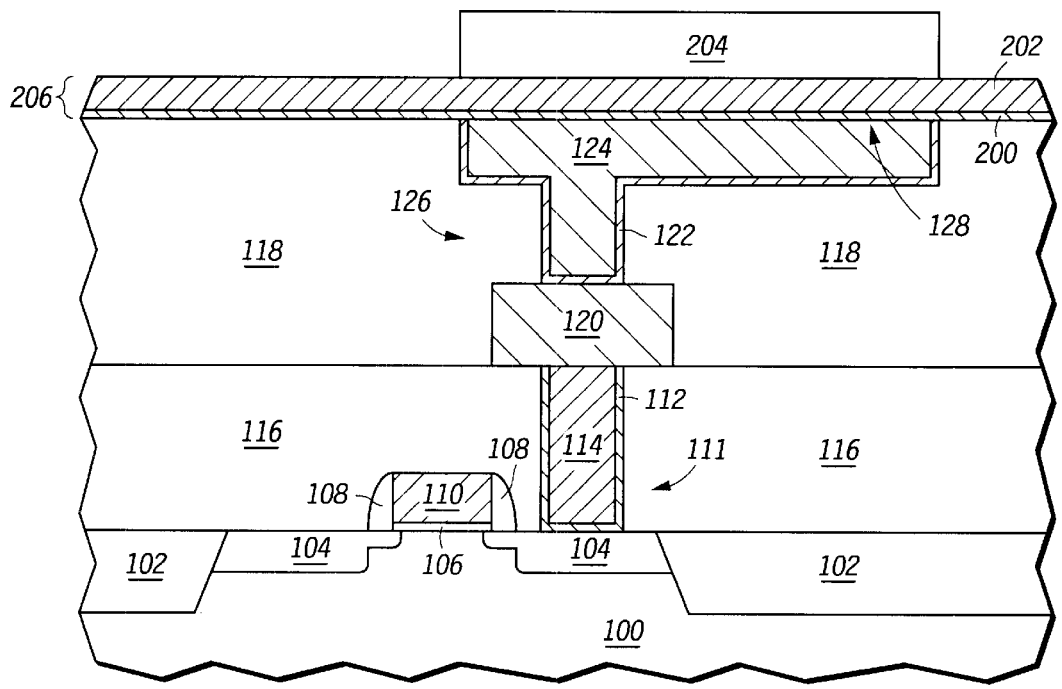
FIG. 2 includes an illustration of a cross-sectional view of the substrate shown in FIG. 1 after forming a transitional metallurgy layer over the substrate and patterning the transitional metallurgy layers with resist.

FIG. 2 further illustrates that a transitional metallurgy layer 206 and a patterned photoresist layer 204 are formed over the ILD 118 and the bond pad 128. In accordance with one embodiment, the transitional metallurgy layer 206 is formed using conductive films 200 and 202. In alternative embodiments, the transitional metallurgy layer can be formed using only the conductive film 202. Typically, the conductive film 200 is used when it is necessary to improve adhesion between conductive film 202 and the underlying bond pad 128. Typically conductive film 200 includes a chromium or a chromium-alloy film that is deposited using PVD methods, such as evaporation, sputtering, ion metal plasma PVD (IMP-PVD), or the like. The thickness of the conductive film 200 is typically in a range of 50–200 nanometers (nm). Alternatively, the conductive film 200 may be formed using other materials such as refractory metals, refractory metal nitrides, or a combination thereof. For example, the conductive film 200 can be formed using titanium (Ti), titanium nitride (TiN), tantalum (Ta), tantalum nitride (TaN), tungsten (W), titanium tungsten nitride (TiWN), titanium tungsten (TiW), tungsten nitride (WN), molybdenum nitride (MoN), cobalt nitride (CoN), or combination thereof.

In accordance with one embodiment, overlying the conductive film 200 is conductive film 202. Conductive film 202 is capping film typically formed of aluminum or an aluminum-alloy containing material. Aluminum capping film is advantageous for several reasons. It provides a standard (i.e. well-understood and characterized) surface upon which subsequently formed packaging interconnects can be formed. It can also be formed using conventional PVD methods, such as evaporation, sputtering, IMP-PVD, or the like. It can be conformally deposited, which can advantageous in embodiments described in FIGS. 4–6 and when it is necessary to cover hillocks and particulates on underlying films, and it provides a hermetic seal to the underlying copper bond pad. The hermetic seal reduces chemical or metallurgical attack of the underlying copper. The thickness of the aluminum is typically in a range of 200–1500 nanometers. Overlying the conductive film 202 is patterned resist layer 204. In accordance with one embodiment, the patterned resist layer 204 masks a portion of transitional metallurgy layer 206 overlying exposed portions of the bond pad 128 as shown in FIG. 2.

Figure 3:
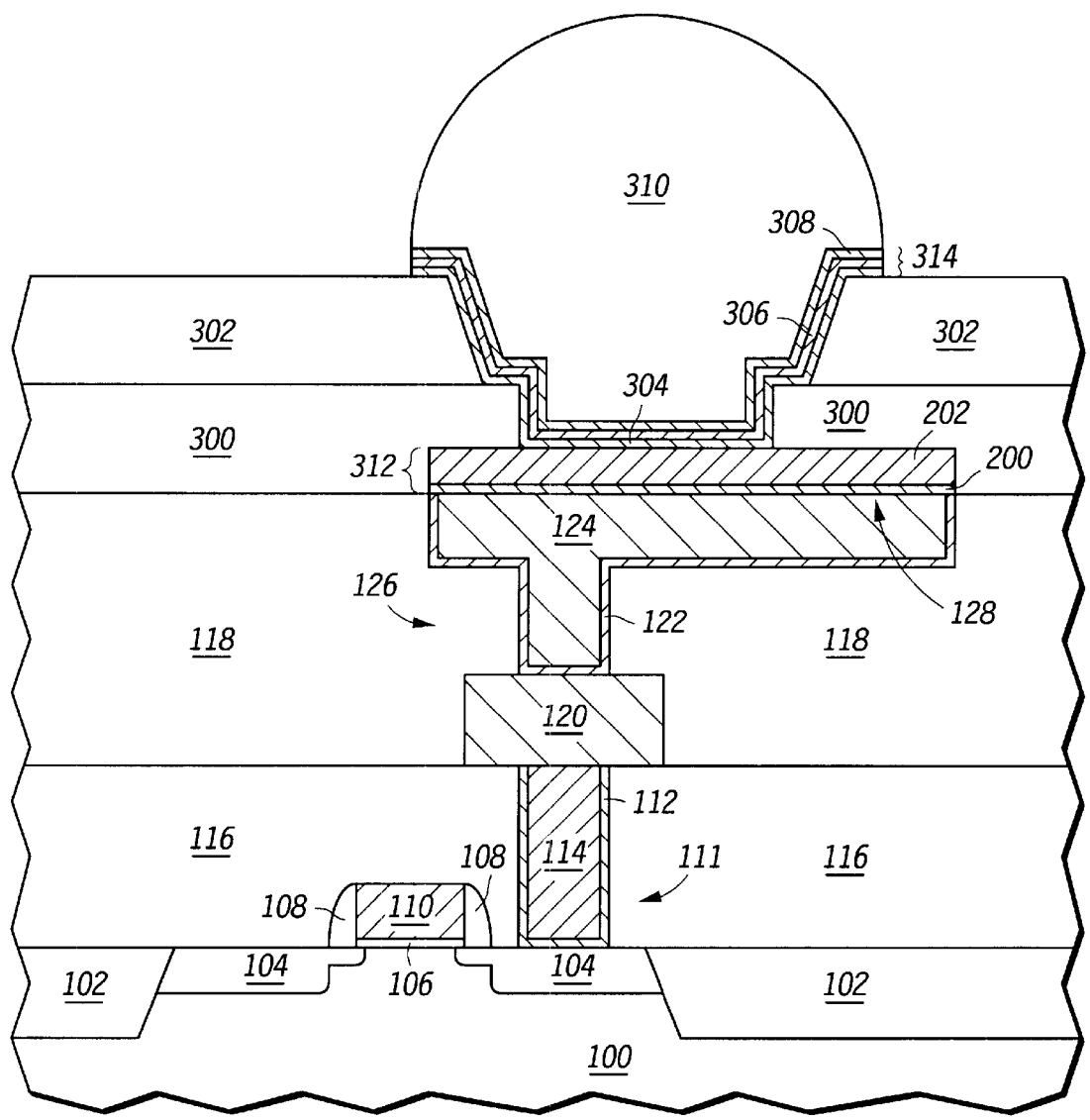
FIG. 3 includes an illustration of a cross-sectional view of FIG. 2 after forming insulating layers and a conductive bump over the transitional metallurgy.

FIG. 3 illustrates that the transitional metallurgy layer 206 has been etched to form a transitional metallurgy structure 312 overlying an exposed portion of the dual inlaid interconnect. Although the transitional metallurgy structure 312 is illustrated as entirely covering the exposed portion of the bond pad 128, in alternative embodiments, it can be formed such that it covers portions smaller than the exposed portion of the bond pad 128 or portions larger the exposed portions of the bond pad 128. After forming the transitional metallurgy structure 312, a passivation layer 300 is formed overlying the transitional metallurgy structure 312 and the ILD 118. Typically, the passivation layer 300 is formed using dielectrics such as plasma-enhanced nitride (PEN), silicon oxynitride (SiON) or a combination of thereof. The passivation layer 300 is then lithographically patterned and etched to form an opening that exposes portions of the transitional metallurgy structure 312. An optional polyimide (die coat) layer 302 is then formed over the passivation layer 300. The polyimide layer is lithographically patterned and then etched (or developed) to form a die coat opening that exposes the opening defined in the passivation layer 300 and the exposed portions of the transitional metallurgy structure 312.

A pad limiting metal (underbump) layer 314, that in one embodiment comprises conductive films 304, 306 and 308, is then formed within the die coat opening and the opening defined passivation layer 300 and electrically contacts the transitional metallurgy structure 312. The pad limiting metal layer typically includes a combination of films that include an adhesion film, an intermediate solderable film and anti-oxidation barrier film. In one embodiment, the pad limiting metal layer 314 includes a composite of chromium film (conductive film 304), copper (conductive film 306) and gold (conductive film 308). The chromium film 304 typically has a thickness in a range of 50–500 nanometers, the copper film 306 typically has a thickness and a range of approximately 700–1300 nanometers, and the gold film 308 typically has a thickness and a range of 80–140 nanometers. Alternatively, the pad limiting metal can include other combinations of films such as a composite of titanium, copper, and gold or a composite of titanium, nickel, copper, and gold. The pad limiting metal layer 314 is typically formed by evaporation using a shadow mask, however, other methods such as sputtering or plating can alternatively be used.

In accordance with one embodiment, following the formation of the pad limiting metal layer, a bump packaging material, such as a lead tin solder material is deposited over the pad limiting metal layer 314 to form a conductive bump 310 as shown in FIG. 3. The conductive bump 310 can be evaporated using a shadow mask or, alternatively, it can be formed using other conventional methods, such as plating or solder jet printing. A reflow process step is then formed to round the corners of the lead tin solder material and form the conductive bump 310 as shown in FIG. 3. At this point in the process, a substantially completed semiconductor device has been fabricated. This device can subsequently be attached to a packaging substrate such as a flip chip or ball grid array package. Although not shown, other levels of interconnects can be formed as needed. Similarly, other interconnects can also be made to the gate electrode 110 and the doped regions 104. If additional interconnects are be formed, they can be formed using processes similar to those used to form and deposit the second ILD layer 118, the first conductive plug 111, the first level interconnect 120, or the second level interconnect 126.

Figure 4:
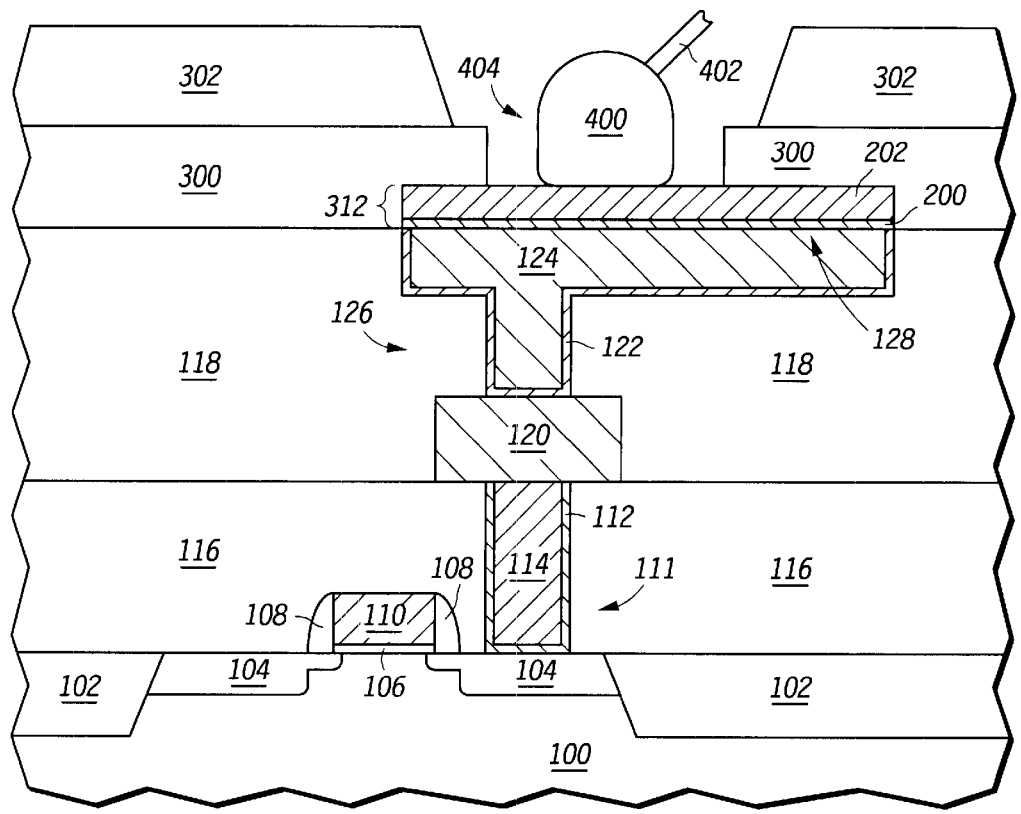
FIG. 4 includes an illustration of a cross-sectional view of the substrate of FIG. 2 after forming passivation and polyimide layers over the substrate and attaching a conductive lead to the transitional metallurgy.

FIG. 4 includes an illustration of an alternative embodiment of the present invention that uses the transitional metallurgy 312 as a wirebond pad overlying the bond pad 128 in conjunction with a wirebond 404 to electrically connect the bond pad 128 to the semiconductor device package. In this embodiment, the wirebond 404 includes bonding portion 400 and wire (conductive lead) 402. As shown in FIG. 4, the wirebond 404 contacts the transitional metallurgy structure 312. The aluminum component (conductive film 202) of the transitional metallurgy structure 312 is softer than prior art tantalum nitride barrier film, and therefore, it is less susceptible to cracking when the wire bond 404 presses against it to form an electrical connection between the wirebond 404 and the bond pad 128. The uppermost portion of the transitional metallurgy 312 has a tendency to deform rather than crack or break when subjected to physical stress. Even if the underlying conductive film 200 cracks or fractures as a result of forces exerted by the wirebond 404, the underlying copper bond pad 128 remains hermetically sealed because the overall integrity of the transitional metallurgy structure 312 remains intact. Thus, in this embodiment, the transitional metallurgy can also advantageously be used as a wirebond pad for copper-based interconnect technologies that has reduced susceptibility to moisture-induced corrosion. In addition, other operations that subject bond pads to physical stresses, such as wafer level burn-in and electrical test, can also be performed using embodiments of the present invention with less concern of exposing the underlying copper bond pad to the external environment.

Figure 5:
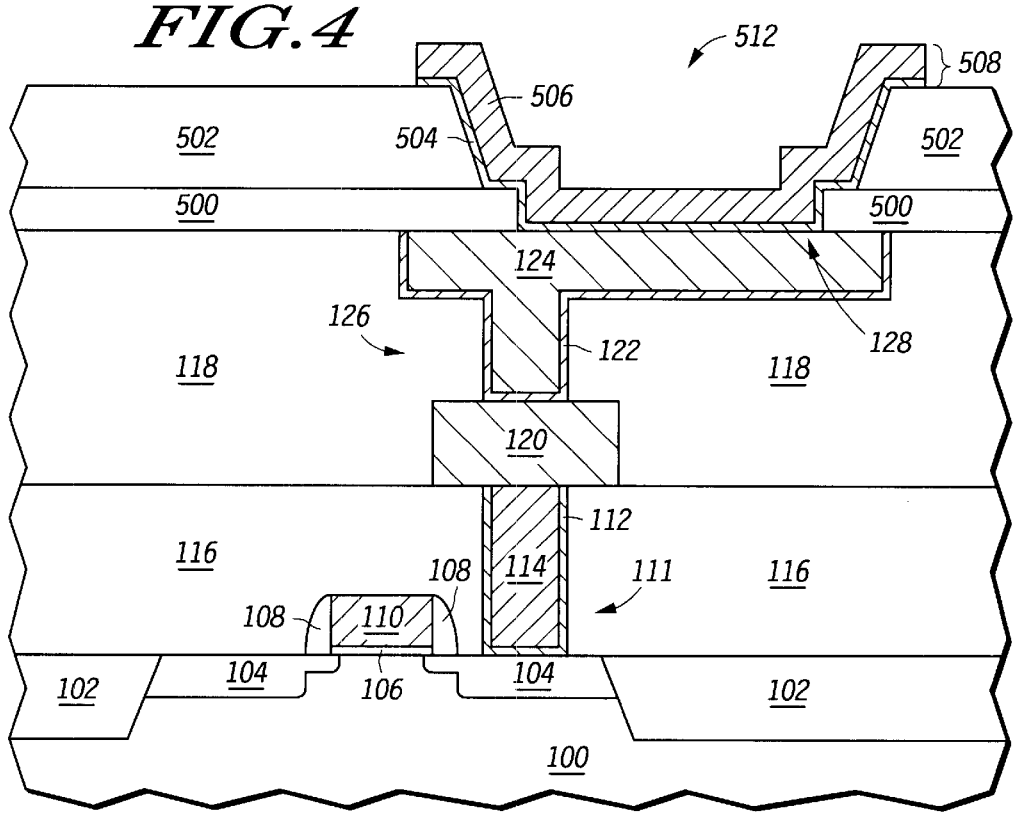
FIG. 5 includes an illustration of a cross-sectional view of FIG. 1 and further shows a transitional metallurgy layer formed within a bond pad opening defined in insulating layers and overlying the conductive bond pad.
Figure 6:
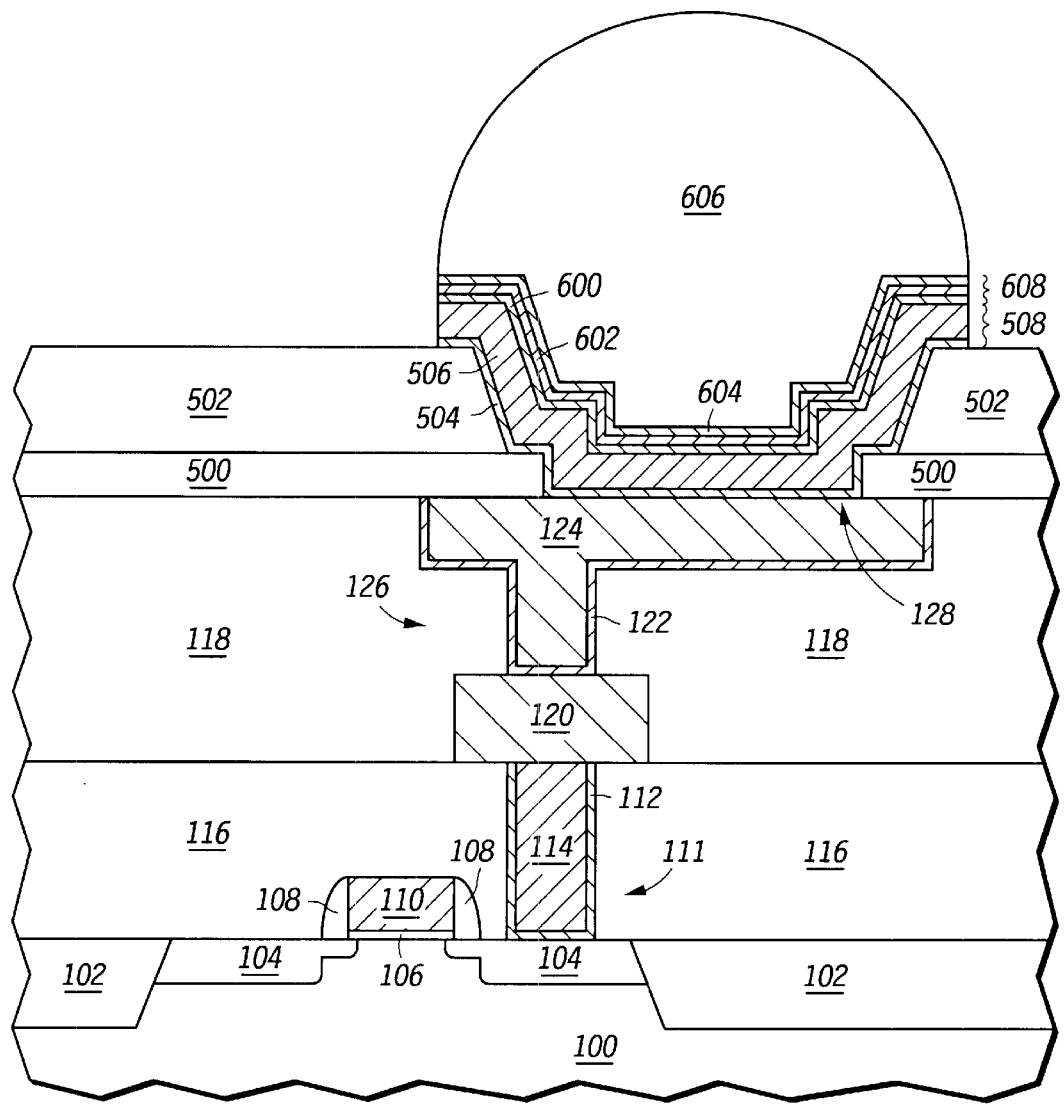
FIG. 6 includes an illustration of a cross-sectional view of FIG. 5 after forming a pad-limiting metal and conductive bump overlying the transitional metallurgy.

FIGS. 5 and 6 illustrate an alternative embodiment that shows that the transitional metallurgy structure 508 is formed after forming the passivation layer 500 and optional polyimide layer 502. As shown in FIG. 5, the passivation layer 500 is formed overlying the second ILD layer 118 and portions of bond pad 128. The passivation layer 500 is formed using materials similar to those described to use the passivation layer 300 in FIG. 3. If a combination of SiON and PEN are used to form the passivation layer 500, it may be advantageous to form the PEN layer on copper bond pad, thereby forming a copper diffusion barrier directly over the exposed copper. The passivation layer 500 is then patterned to form an opening 512 that exposes portions of the bond pad. An optional polyimide layer 502 is then formed overlying the passivation layer. The polyimide layer is patterned and etched (or developed) to form an opening that exposes the opening 512, as shown in FIG. 5.

The transitional metallurgy structure 508 is then formed within the opening 512, such that it electrically contacts and covers exposed portions of the conductive bond pad. In accordance with one embodiment, the transitional metallurgy layer (conductive films 504 and 506) is formed using materials similar to those used to form the transitional metallurgy 312 in FIGS. 1–3 (conductive films 200 and 202). The transitional metallurgy structure 508 can be formed as a blanket layer using PVD methods, such as evaporation, sputtering, IMP-PVD, or the like and then patterned and etched or, alternatively, by selectively depositing the transitional metallurgy through a shadow mask.

In FIG. 6, a pad limiting metal layer 608 and a conductive bump 606 are formed overlying the transitional metal structure 508. In accordance with one embodiment, the pad limiting metal layer is formed from a combination of conductive films that include conductive film 600, conductive film 602 and conductive film 604. The materials and processes used to form the pad limiting metal layer 608 can be similar to those materials and processes used to form the pad limiting metal layer 314 shown in FIG. 3. Similarly, the conductive bump 606 is formed using processes and materials similar to those used to form the conductive bump 310 shown in FIG. 3. This embodiment may be advantageous because each one of the films in the transitional metallurgy structure 508 and the pad limiting metal layer 608 can all be deposited during a single deposition cycle. For example, the substrate can be placed into a PVD, chamber wherein each one of the films 504, 506, 600, 602 and 604 can each be sequentially deposited either selectively or as blanket films and then, if necessary, patterned and etch to form the respective transitional metallurgy structure 508 and the pad limiting metal layer 608.

The transitional metallurgy structures 312 and 508 in FIGS. 1–6 can also be used to provide a surface for plating (electroplating and electroless plating) PLMs and studs prior to forming the conductive bumps. Processes for plating (electroplating and electroless plating) films onto aluminum are conventional to those of ordinary skill in the art and may be preferred because of their simplicity and relative low cost. This may be advantageous because materials integration issues related to plating films onto copper bond pads and the prior art can be problematic. For example, nickel is commonly electrolessly plated onto aluminum to form portions of the PLM because of its relatively low cost compared to other PLM processes and materials. However, electrolessly plating nickel onto copper can contaminate and corrode the underlying copper. Using the prior art tantalum barrier layer will not resolve this integration issue because surfaces such as tantalum nitride cannot readily be plated.

Figure 7:
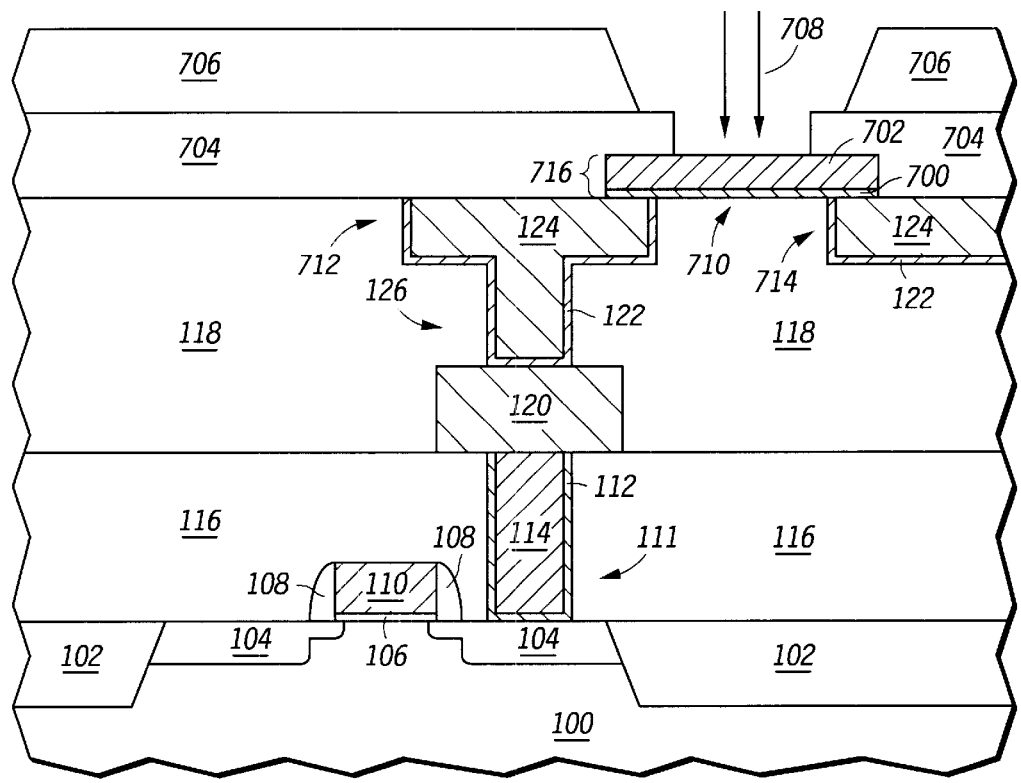
FIG. 7 includes an illustration of a cross-sectional view shown in FIG. 1 and additionally includes an alternative embodiment, wherein the transitional metallurgy forms a laser-alterable fuse structure.

Embodiments of the present invention can also advantageously be used to protect the bond pads during wafer level burn-in and electrical test operations. This allows the device to be burned-in and tested without undesirably oxidizing or corroding the bond pad. Similarly if bumps are to be formed on the device, the device can be burned in or tested prior to forming bumps. This eliminates the likelihood that the bumps are damaged or distorted by the physical contact with the test or burn-in probes Shown in FIG. 7 is an alternative embodiment of the present invention that incorporates the use of a transitional metallurgy similar to that shown in FIGS. 1–4. However, in this embodiment the transitional metallurgy structure 716 is being used to form a laser or energy alterable fuse structure 710 between two conductive regions 712 and 714 of the semiconductor device. The conductivity between these two regions can be modified using the laser or other energy source 708, thereby programming or adjusting the device circuitry. Forming the laser alterable fuse structure 710 using the transitional metallurgy has advantages over the prior art. The transitional metallurgy is less prone to corrosion than the prior art copper when exposed to the external environment, and its use eliminates a potential copper migration source; therefore the reliability of the laser alterable fuse structure and the semiconductor device is improved. In addition, the transitional metallurgy is typically thinner than the copper interconnect layer normally used to form the fuses, and it is formed closer to the uppermost surface of the semiconductor device. This allows the laser to use less power to affect the conductivity of the laser alterable fuse connection, which correspondingly reduces the potential of causing shorts, damaging adjacent connections, and damaging the adjacent passivation layer; 702 and polyimide layer 706. Furthermore, both the transitional metallurgy structure 312 overlying the conductive bond pad (shown in FIGS. 3 and 4) and the laser alterable fuse structure 710 can be formed simultaneously using the same transitional metallurgy layer 206 (shown in FIG. 2). Therefore, the process integration requires no additional processing steps.

Figure 8:
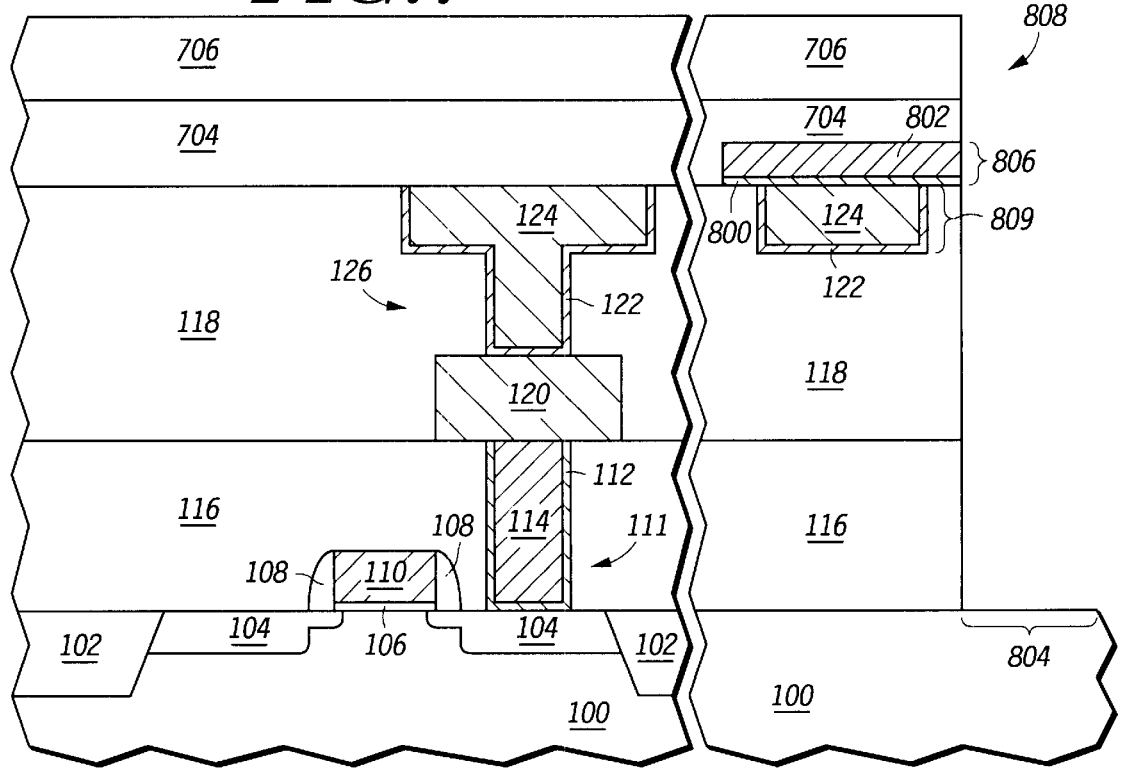
FIG. 8 includes an illustration of a cross-sectional view of FIG. 1 and additionally includes an alternative embodiment, wherein the transitional metallurgy forms an edge seal capping layer.

Shown in FIG. 8 is yet another alternative embodiment of the present invention, wherein the transitional metallurgy is used to cap a portion of the semiconductor die edge seal formed by a copper-containing interconnect level. FIG. 8 includes an illustration of a semiconductor device similar to that shown in FIG. 4 and additionally shows an edge region 808 of the semiconductor die near a scribe line region 804 of the semiconductor substrate 100. As shown in FIG. 8, the transitional metallurgy 806 is formed overlying a copper edge seal portion 809 that is positioned at or near the periphery of the semiconductor die. The transitional metallurgy 806 includes conductive films 800 and 802, which are similar to the conductive films 200 and 202 shown in FIGS. 2–4. When copper is used to form portions of the edge seal, adhesion between copper edge seal and overlying layers, such as the passivation layer 704, can be problematic and delamination can occur. This can result in portions of the copper edge ring seal being exposed and potentially produce corrosion and reliability concerns. However, capping the edge seal formed by the uppermost copper interconnect with the transitional metallurgy 806 improves adhesion of the overlying passivation layer, thereby reducing the potential for delamination.

In yet another embodiment (not shown), the transitional metallurgy used in FIGS. 5 and 6 can also be used to prevent delamination of the passivation layer at the edge region. In this embodiment, the transitional metallurgy could be formed such that it covers the uppermost exposed surface (i.e. passivation or polyimide layer) and sidewalls at the edge of the die. In this manner, the transitional metallurgy would encapsulate the passivation layer and the uppermost interconnect level, thereby reducing the likelihood, that delamination of the passivation layer would occur.

The embodiments described herein are advantageous for several reasons. They can be integrated into an existing process flow without a need to use exotic materials, develop new processes, or purchase new processing equipment. They provide protection of the underlying copper bond pad by preventing moisture from an external environment and lead tin solder from bump structures from reacting with the copper bond pads. They can be extended for use in a variety of other applications, such as fuses and edge seals. They can be used to protect the bond pads during a variety of burn-in and test operations; and they provide a standardized bond pad platform that can be integrated with a variety of existing bump and wirebond technologies, thereby providing a common platform that can be transferred and used by existing semiconductor packaging facilities.

In the forgoing specification, the invention has been described with reference to specific embodiments. However, one of ordinary skill in the art appreciates that various modifications and changes can be made without departing from the scope of the present invention, as set forth in the claims below. Accordingly, the specification and figures are to be regarded in an illustrative rather than a restrictive sense and all such modifications are intended to be included within the scope of the present invention. Benefits, other advantages, and solutions to problems have been described with regard to specific embodiments. However, the benefits, advantages, solutions to problems, and any elements that may cause any benefit, advantage, or solution to occur or become more pronounced are not to be construed as a critical, required, or essential feature or element of the claims.

What is claimed is:

1. A method for forming a semiconductor device, comprising:

forming a first mostly copper-containing bond pad overlying a semiconductor device substrate;

forming a chromium-containing adhesion film over the mostly copper-containing bond pad;

forming an aluminum-containing capping film overlying the chromium-containing adhesion film;

forming at least two conductive regions over the semiconductor device substrate; and connecting the aluminum-containing capping film to the at least two conductive regions and rendering the connection laser alterable.

2. The method of claim 1, wherein the adhesion film has a thickness in a range of approximately 50 nanometers to 200 nanometers.

3. The method of claim 1, wherein the aluminum-containing capping film has a thickness in a range of approximately 200 nanometers to 1500 nanometers.

4. The method of claim 1, further comprising forming a passivation layer overlying the aluminum-containing capping film, wherein the passivation layer has an opening that exposes a portion of the aluminum-containing capping film.

5. The method of claim 1, further comprising:

forming a passivation layer over the copper-containing bond pad; and forming an opening in the passivation layer, wherein forming the opening is performed prior to forming the aluminum-containing capping film and exposes a portion of the copper-containing bond pad.

6. The method of claim 1, further comprising:

forming a pad limiting metal layer that electrically contacts the aluminum-containing capping film; and forming a conductive bump that electrically contacts the pad limiting metal layer.

7. The method of claim 6, wherein the pad limiting metal layer includes a material selected from the group consisting of titanium, chrome, nickel, copper and gold.

8. The method of claim 1 further comprising forming a conductive bump overlying the aluminum-containing capping film.

9. The method of claim 1, further comprising bonding a wire to the aluminum-containing capping film.

10. The method of claim 1, further comprising:

forming a seed layer overlying the aluminum-containing capping film; and electrolessly plating a conductive post over the seed layer, wherein the conductive post is adapted to receive a conductive bump.

11. The method of claim 10, wherein the conductive post include a material selected from a group consisting of nickel, copper, and gold.

12. The method of claim 1, wherein forming the aluminum-containing capping film further comprises selectively depositing the aluminum-containing capping film over a portion of the first mostly copper-containing bond pad.

13. The method of claim 1, further comprising testing an electrical circuit prior to attaching one of a conductive bump and a bonding wire connection to the aluminum-containing capping film, wherein testing includes physical contact between the aluminum-containing capping film and an electrical probe, and wherein the aluminum-containing capping film prevents physical contact between the electrical probe and the mostly copper containing bond pad.

14. A method for forming a semiconductor device, comprising:

forming a mostly copper-containing bond pad overlying a semiconductor device substrate;

forming at least two conductive regions over a semiconductor device substrate;

forming an aluminum-containing capping film overlying a portion of the mostly copper-containing bond pad, wherein portions of the aluminum-containing capping film also form a connection between the at least two conductive regions; and rendering the connection laser alterable.

* * * * *